United States Patent [19]

Fujikura

[11] Patent Number: 4,937,458
[45] Date of Patent: Jun. 26, 1990

[54] ELECTRON BEAM LITHOGRAPHY APPARATUS INCLUDING A BEAM BLANKING DEVICE UTILIZING A REFERENCE COMPARATOR

[75] Inventor: Yoichi Fujikura, Katsuta, Japan

[73] Assignee: Hitachi, Ltd., Tokyo, Japan

[21] Appl. No.: 257,872

[22] Filed: Oct. 14, 1988

[30] Foreign Application Priority Data

Oct. 16, 1987 [JP] Japan .................................. 62-259715

[51] Int. Cl.⁵ .............................................. H01J 37/30
[52] U.S. Cl. .................................. 250/492.2; 250/397; 250/398
[58] Field of Search ............. 250/492.2, 492.22, 492.3, 250/396 R, 398, 306, 310, 397

[56] References Cited

U.S. PATENT DOCUMENTS

| | | | |
|---|---|---|---|
| 4,130,761 | 12/1978 | Matsuda | 250/492.2 |
| 4,151,417 | 4/1979 | Takigawa | 250/492.2 |
| 4,286,154 | 7/1981 | Okubo et al. | 250/492.2 |
| 4,634,871 | 1/1987 | Knauer | 250/492.2 |
| 4,710,640 | 12/1987 | Kawasaki | 250/492.2 |
| 4,777,369 | 10/1988 | Nakamura et al. | 250/492.2 |
| 4,818,885 | 4/1989 | Davis et al. | 250/492.2 |

FOREIGN PATENT DOCUMENTS

| | | | |
|---|---|---|---|
| 140628 | 11/1981 | Japan | 250/492.2 |
| 078138 | 5/1982 | Japan | 250/492.2 |
| 112026 | 7/1982 | Japan . | |
| 167422 | 8/1985 | Japan | 250/492.2 |

*Primary Examiner*—Bruce C. Anderson
*Attorney, Agent, or Firm*—Antonelli, Terry, Stout & Kraus

[57] ABSTRACT

In an electron beam lithography apparatus having an electron gun for producing an electron beam, an electron beam shaping lens and a deflector for deflecting the electron beam in accordance with a pattern to be drawn on an object, a blanking electrode unit and a stop electrode unit having an aperture therein are provided so that when a pattern need not be drawn the electron beam is deviated by the blanking electrode unit away from the aperture in the stop electrode unit. In one embodiment, the stop electrode unit serves to detect the amount of that portion of the electron beam which does not pass through the aperture so that a detection value corresponding to the detected amount of the electron beam is compared with a reference value. When the detection value exceeds the reference value, it is determined that a shot of pattern drawing is effected with the electron beam.

9 Claims, 4 Drawing Sheets

ELECTRON BEAM LITHOGRAPHY APPARATUS INCLUDING A BEAM BLANKING DEVICE UTILIZING A REFERENCE COMPARATOR

BACKGROUND OF THE INVENTION

The present invention relates to an electron beam lithography apparatus and more particularly to a lithography control apparatus with improved reliability.

An electron beam lithography apparatus alternately assumes a beam blanking state and a beam unblanking state in order to draw or write a pattern on an object such as a semiconductor wafer with an electron beam. More specifically, first, the electron beam is placed in its blanking state by applying a voltage to an electrostatic electrode provided in an electron beam path in synchronism with disappearance of a pattern signal in order to deviate the electron beam away from a stop electrode aperture provided in the electron beam path. Next, the voltage applied to the electrostatic electrode is removed in synchronism with appearance of the pattern signal so that the object is irradiated with the electron beam passing through the stop electrode aperture for a predetermined time to thereby draw a pattern on the object. Thereafter, the beam blanking is performed again in synchronism with disappearance of the pattern signal, and so on.

As described above, the electron beam lithography apparatus draws a pattern with alternately repeated blanking and unblanking (exposure) states. Therefore, in order to satisfactorily draw a pattern, it is necessary to detect and control the number of times of irradiating the object with the electron beam (hereinafter referred to as the number of shots).

Conventionally, this shot number was detected by counting the number of times of turn-on and turn-off of the voltage applied to the electrostatic electrode. Therefore, the counted number of shots coincides with the number of shots instructed by a controller, but does not necessarily represent the result of pattern drawing actually effected. JP-A- No. 57-112026 (laid-open on July 12, 1982) shows a lithography apparatus in which the number of times of object irradiation is determined on the basis of a blanking signal.

SUMMARY OF THE INVENTION

An object of the present invention is to provide an electron beam lithography apparatus which is capable of counting the number of pattern drawing shots of an electron beam actually contributing to the writing or drawing of a pattern, thereby improving the reliability of the apparatus.

Patterns are drawn on an object by repeatedly irradiating of the object with an electron beam for exposure of the object and for blanking the electron beam.

The present inventor thought, in the course of making the present invention, that states of exposure and blanking might be detected and monitored by several techniques. One technique of detecting exposure and blanking based on information from the object requires the object to be insulated from a movable stage carrying the object and so will have a disadvantage that charges may accumulate on the object which may electrostatically destroy minute patterns.

Meanwhile, in another technique, a pattern signal is divided into graphically identical parts or data each for one shot of pattern drawing with an electron beam so that exposure and blanking operations are alternately repeated, and the number of times presence or absence of the pattern signal are counted to detect the number of pattern drawing shots of the electron beam. However, this will not be satisfactory since it is uncertain that the electron beam actually performs exposure/blanking operations in accordance with the presence/cease of the pattern signal.

To solve these problems, it is indispensable to measure the electron beam actually unblanked and blanked for the pattern drawing.

In accordance with one aspect of the present invention, a blanking electrode unit and a stop electrode unit are provided in an electron beam passage. The stop electrode unit has an aperture formed therein for limiting the electron beam when a pattern signal ceases and a pattern need not be drawn, and a voltage is applied to the blanking electrode unit to deviate the electron beam so that it does not bombard an object owing to the provision of the stop electrode unit. In one embodiment, the stop electrode unit serves to detect the amount of that portion of the electron beam which does not pass through its aperture. The value (detection value) corresponding to the detected amount of the electron beam is compared with a reference value. When the detection value exceeds the reference value, it is determined that a shot of pattern drawing has been effected with the electron beam.

In accordance with another aspect of the present invention, a voltage is applied to and released from the blanking unit provided in the electron beam path in order to radiate the electron beam to the stop unit and pass the electron beam through the stop unit, and the amount of the electron beam radiated to the stop unit is detected through its current-voltage conversion to confirm that the electron beam is actually deviated.

The following operations are carried out for the blanking unit disposed in a passage of the electron beam and the stop unit disposed downstream of the electron beam with respect to the blanking unit in order to place the electron beam in its exposure state and its blanking state for an object on which a pattern is to be drawn. In the exposure state in which a pattern signal appears, a voltage is not applied to the blanking unit so that the electron beam passes through the aperture of the stop unit for drawing the pattern and so is not radiated to the stop unit itself. On the other hand, in the blanking state in which a pattern signal disappears, the electron beam is wholly radiated to the stop unit. This amount of the electron beam is detected through, e.g., current-voltage conversion, and the value corresponding to the detected amount of the electron beam is compared with a reference value representative of an amount of an electron beam previously set on the basis of information obtained by measurement of an amount of an electron beam bombarding a surface of the object, such reference value being set by, e.g., a control computer, in order to detect that the electron beam is actually unblanked. This is counted as a shot of pattern drawing. The number of such shots of successive pattern drawings may further be compared with those obtained from data of the pattern signal divided into graphically identical parts, each for one shot of pattern drawing with the electron beam. This may be effected, e.g., in the control computer.

Thus, the number of shots in successive pattern drawings can be recognized and monitored so that an error in drawing a pattern can be detected, thereby permitting a pattern to be drawn with high reliability.

Further, the pattern drawing state can be monitored in such a manner that the blanking state can be recognized for each shot of pattern drawing.

DESCRIPTION OF THE PREFERRED EMBODIMENTS

Figure 1:
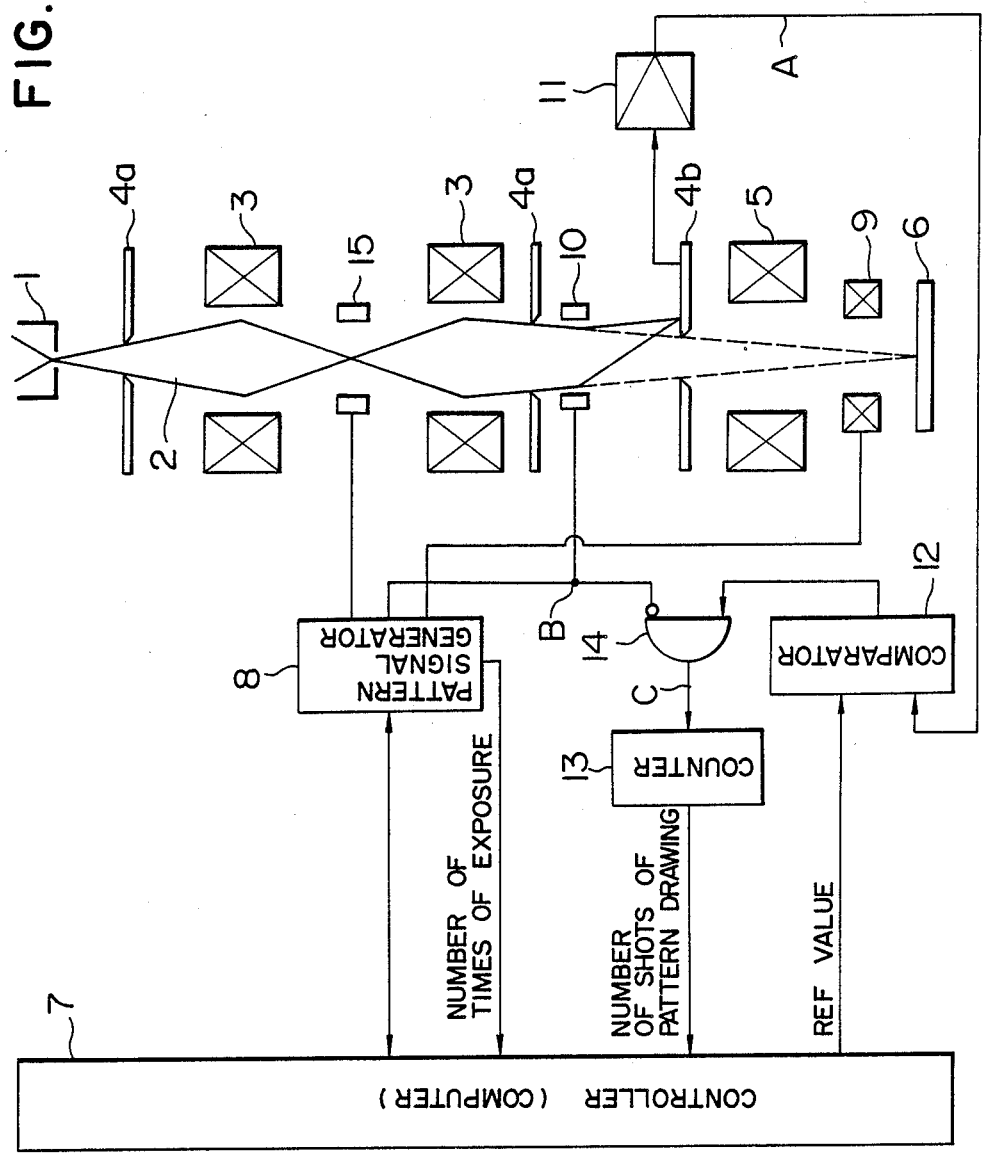
FIG. 1 is a schematic block diagram of an electron beam lithography apparatus according to one embodiment of the present invention.

One embodiment of the present invention will be explained with reference to FIG. 1. In FIG. 1, 1 represents an electron gun; 2 an electron beam; 3 a shaping lens; 4a a shaping stop electrode unit; 4b an objective stop electrode unit made of a non-magnetic, electrically conductive material; 5 a projection lens; 6 an object such as, for example, a semiconductor wafer with a resist film thereon; 7 a controller (computer) constituted by, for example, 32-bit super minicomputer such as Micro VAX-II (made by Digital Equipment Company); 8 a pattern signal generator; 9 a deflector; 10 a blanking electrode unit; 11 a current-voltage converter; 12 a comparator; 13 a counter; 14 an AND circuit; and 15 a shaping deflector. The electrode unit 4b may be made of, for example, Mo, W, phosphor bronze or stainless steel.

Figure 2:
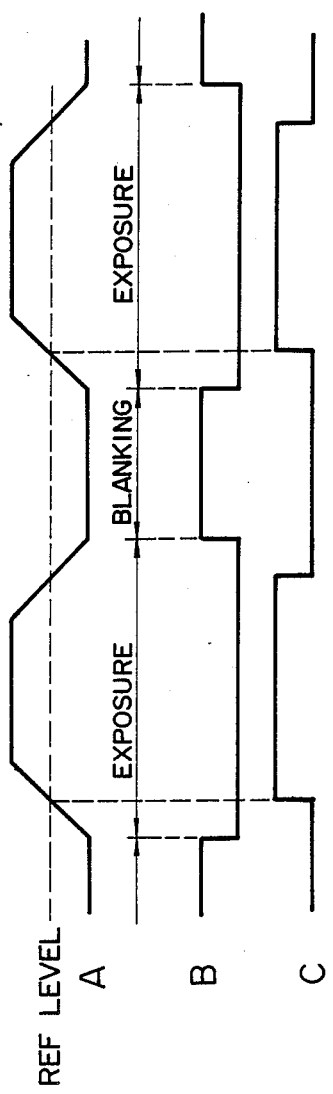
FIG. 2 is a waveform chart showing a method of counting the number of shots of pattern drawing.

The electron beam 2 emitted from the electron gun is projected onto the shaping stop electrode unit 4a through the shaping lens 3 and the shaping deflector 15 to be shaped into, for example, a rectangular shape and focused as a rectangular beam on the object 6 through the projection lens 5. On the other hand, in response to data sent from the controller 7 to the pattern signal generator 8, the pattern signal generator 8 sends a pattern signal to the deflector 9. The pattern signal is used to scan the object 6 with the electron beam 2 on the object. At the same time, by applying a blanking voltage (a blanking signal) B as shown in FIGS. 1 and 2 to the blanking electrode unit 10, the electron beam 2 is controlled so that it is placed in its blanking state or its exposure state as indicated by the solid line and the dotted line of FIG. 1, respectively. The blanking signal B is also supplied to one input terminal (an inverted input terminal) of the AND circuit. The object 6 is exposed to the electron beam 2 in the exposure state.

The pattern signal generator 8 may be implemented in such a structure as shown in The 95th STUDY MEETING PAPER for Committee 132 Electron and Ion Beam Science and Technology, July 16, 1986 (Japan Society for the Promotion of Science), pp. 1-3.

The amount of the electron beam radiated to the objective stop electrode unit 4b in the blanking state having been previously detected by the current-voltage converter 11, the value corresponding to, e.g., ½ of the detected beam amount is set, as a reference value, into the comparator 12 from, e.g., the controller 7. Prior to starting of a pattern drawing, the blanking electrode unit 10 with a high level blanking voltage B applied thereto serves to deviate the electron beam so that the beam is cut by the objective stop electrode unit 4b during an analog circuit setting time and a pattern data waiting time. Then, a beam current radiated to the objective stop electrode unit 4b is detected by the current-voltage converter 11 and sent to the comparator 12. The comparator 12 compares the output from the converter 11 with the reference value set by the controller 7 and supplies a signal to the other input terminal (non-inverted input terminal) of the AND circuit 14 when the output from the converter 11 exceeds the reference value. The output C of the AND circuit 14 is supplied to the counter 13. As seen from FIG. 2, the state in which the electron beam 2 is cut by the objective stop electrode unit 4b is referred to as the blanking state, in which the output A of the converter 11 holds "L" (low) level, for example. Hence, the output of the comparator 12 is at "L" level, too. At this time, the AND circuit is receiving at its inverted input terminal the blanking voltage B at "H" (high) level. Next, when the blanking voltage B applied from the pattern generator 8 to the blanking electrode unit 11 is released i.e., when the voltage B assumes "L" level, the electron beam passes through the aperture of the objective stop electrode unit 4b for drawing a pattern and is not radiated to the objective stop electrode unit 4b itself. This state is detected by the current-voltage converter 11. That is, when the output level of the comparator 12 is changed to provide the AND circuit 14 with an "H" level output, the counter 13 operates to store one "shot" of pattern drawing. As seen from FIG. 2, this state in which the electron beam 2 passes through the aperture of the objective stop electrode unit 4b is referred to as the exposure state. The converter 11 is, in this embodiment, designed to hold its "H" (high) level in this state, for example. After the object is exposed to the electron beam for a predetermined time in accordance with the pattern signal B sent from the pattern signal generator 8, the electron beam is placed in its blanking state. In this way, in response to the signal sent from the pattern signal generator 8, the blanking state and the exposure state are alternately repeated so that the number of shots of pattern drawing is counted, thereby completing successive shots of pattern drawing. Upon completion of the successive shots of pattern drawing, the controller 7 may read the number of times of exposure from the pattern signal generator 8 and the number of shots of pattern drawing from the counter 13 and compare them to decide if the pattern drawing has been preferably performed.

In accordance with this embodiment of the present invention, the drawing result can be determined without observing an object by the number of shots of pattern drawing which number can be recognized and monitored. Thus, drawing with high reliability is possible.

In the above described embodiment, the amount of the electron beam radiated onto or bombarding the stop electrode unit is detected for the purpose of detecting a shot of pattern drawing. However, secondary electrons generated by radiation of the stop electrode unit with an electron beam and reflecting therefrom or secondary electrons generated by radiation of the object (e.g., a semiconductor wafer) with an electron beam and reflecting therefrom may be detected for the detection of the shot of pattern drawing.

Figure 3:
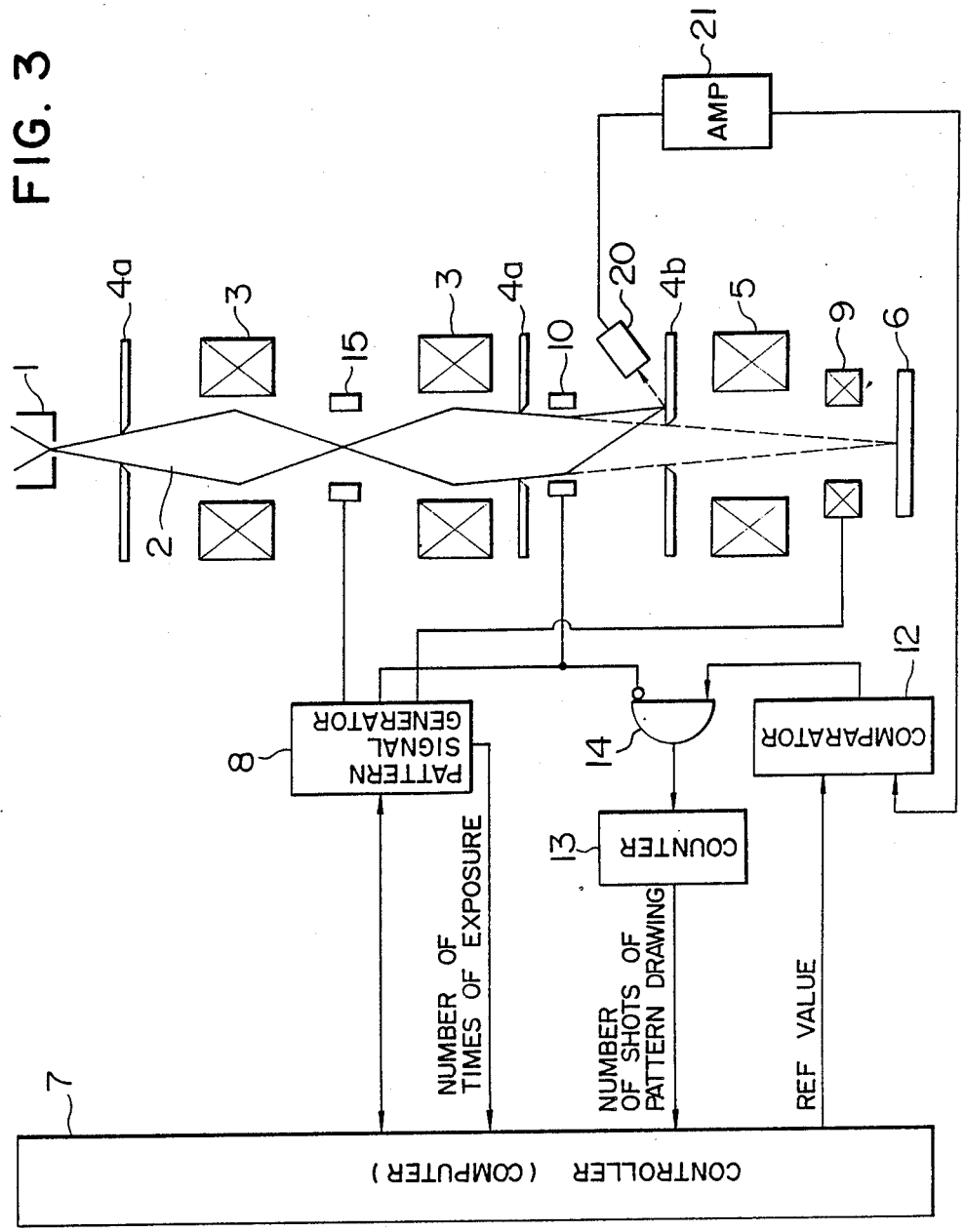
FIGS. 3 and 4 are schematic block diagrams of an electron beam lithography apparatus according to other embodiments of the present invention.

FIG. 3 shows another embodiment in which reflective secondary electrons generated by radiation of the stop electrode unit 4b with the electron beam 2 are detected by a secondary electron detector 20 arranged in the vicinity of the electrode unit 4b, so that the detection output of the detector 20 is amplified by an amplifier 21 and supplied to the comparator 12. In this embodiment, use is made of a result of detection of the number of times of beam blanking, as in the first described embodiment, for the detection of the number of times of pattern drawing shots.

Figure 4:
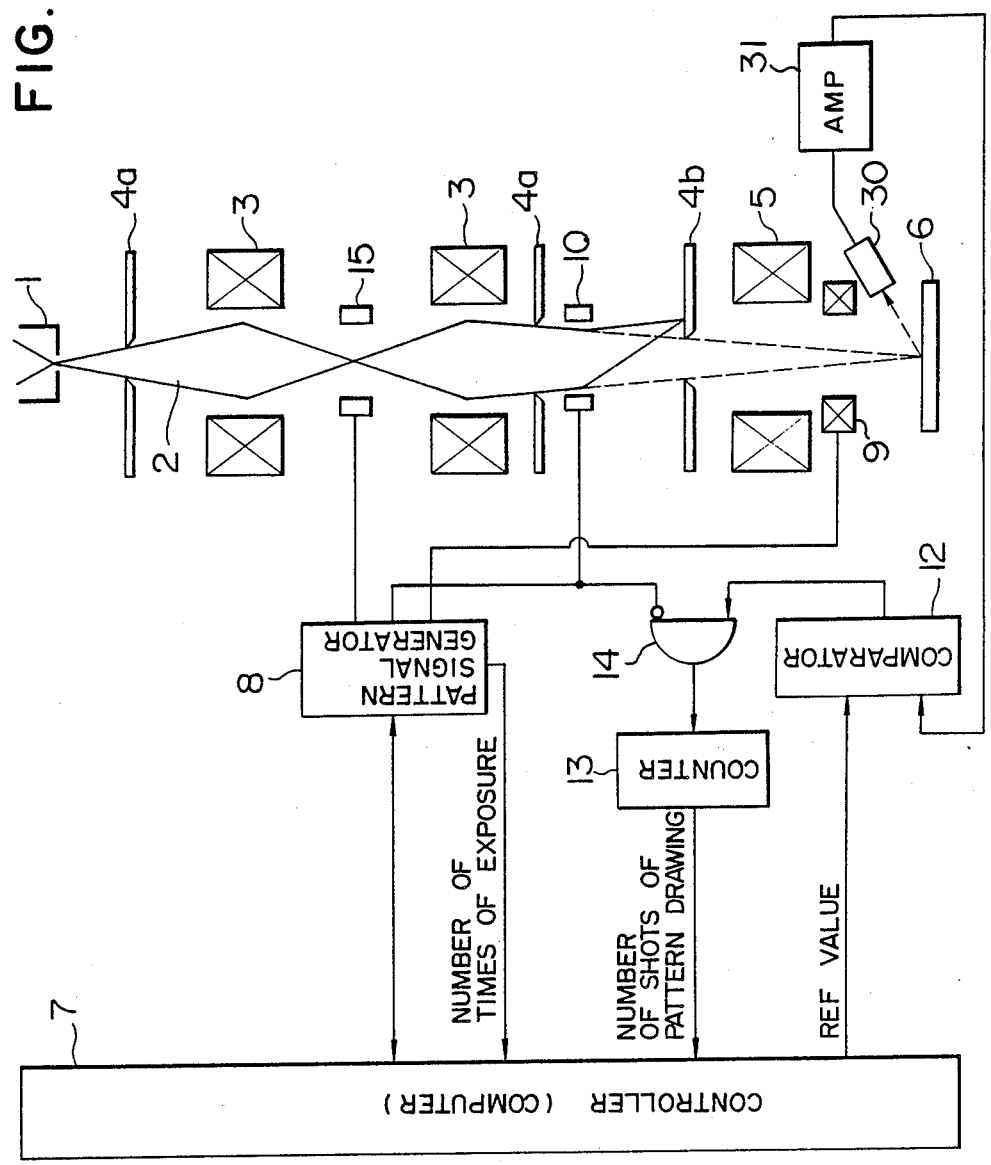

FIG. 4 shows another embodiment in which reflective secondary electrons generated by radiation of the object 6 with the electron beam 2 are detected by a secondary electron detector 30 arranged in the vicinity of the object 6 or in the vicinity of a movable stage (not shown) carrying the object 6 so that the detection output of the detector 20 is amplified by an amplifier 31 and supplied to the comparator 12. In this embodiment, use is made of a result of detection of the number of times of beam unblanking for the detection of the number of times of pattern drawing shots.

I claim:

1. An apparatus for writing a pattern on an object with an electron beam, comprising:
   electron gun means for projecting an electron beam along a path;
   means for deflecting said electron beam in accordance with a pattern to be drawn on an object;
   means disposed along said path of said electron beam for limiting said electron beam;
   detecting means for detecting that portion of said electron beam which is prevented from passing through the limiting means;
   means disposed along said path upstream of said limiting means for deviating said electron beam so that said electron beam is prevented from bombarding said object when no pattern is to be drawn on said object; and
   means for comparing an output of said detecting means with a previously set reference value and for generating an output signal corresponding to a shot of pattern writing by said electron beam on said object when the output of said detecting means exceeds said reference value.

2. An electron beam lithography apparatus comprising:
   an electron gun for projecting an electron beam along a path;
   a deflecting electrode unit for deflecting said electron beam in accordance with a pattern to be drawn on an object;
   a stop electrode unit having an aperture disposed along said path of said electron beam for limiting said electron beam;
   a blanking electrode unit disposed along said path upstream of said stop electrode unit for deviating said electron beam away from said aperture of said stop electrode unit so that said electron beam is prevented from reaching said object when no pattern is to be drawn on said object;
   a detection unit for detecting an amount of that portion of said electron beam which is prevented from passing through the aperture of said stop electrode unit; and
   a comparator unit for comparing a detection output of said detection unit with a previously set reference value and for generating an output signal corresponding to a shot of pattern drawing by said electron beam on said object when the detection output of said detection unit exceeds said reference value.

3. An electron beam lithography apparatus comprising:
   means for projecting an electron beam along a path;
   beam deflecting means for deflecting said electron beam on a surface of an object in accordance with a pattern signal;
   stop means provided along said path for limiting said electron beam;
   blanking means provided along said path upstream of said stop means for deviating said electron beam so that said electron beam is blocked by said stop means so as to prevent said electron beam from irradiating said object when no pattern is to be drawn on the surface of said object;
   means for detecting the blocking of said electron beam and for determining the number of times the electron beam is blocked by said stop means; wherein
   said detecting and determining means includes a secondary electron detector provided for detecting secondary electrons emitted by said stop means upon the blocking of said electron beam by said stop means.

4. An apparatus according to claim 3, further comprising a signal source means coupled to said beam deflecting means and said blanking means so that said signal source means supplies said pattern signal to said beam deflecting means and a blanking signal to said blanking means.

5. An apparatus according to claim 3, wherein said detecting and determining means further includes a comparator for comparing an output of said secondary electron detector with a previously set reference value to generate a signal corresponding to a blocking of the electron beam when the output of said detector exceeds said reference value.

6. An electron beam lithography apparatus comprising:
   means for projecting an electron beam along a path;
   beam deflecting means for deflecting said electron beam on a surface of an object in accordance with a pattern signal;
   stop means provided along said path for limiting said electron beam;
   blanking means provided along said path upstream of said stop means for deviating said electron beam so that said electron beam is blocked by said stop means so as to prevent said electron beam from irradiating said object when no pattern is to be drawn on the surface of said object;
   means for detecting irradiation of said object by said electron beam upon said deflection and for determining the number of times the electron beam irradiates said object; wherein
   said detecting and determining means includes a secondary electron detector provided for detecting secondary electrons emitted by said object upon the irradiation of said object by said electron beam.

7. An apparatus according to claim 6, further comprising a signal source means coupled to said beam deflecting means and said blanking means so that said signal source means supplies said pattern signal to said beam deflecting means and a blanking signal to said blanking means.

8. An apparatus according to claim 7, wherein said detecting and determining means further includes a comparator for comparing an output of said secondary electron detector with a previously set reference value to generate a signal corresponding to an irradiation of said object by said electron beam when the output of said detector exceeds said reference value.

9. An apparatus for writing a pattern on an object with an electron beam, comprising:
  electron gun means for producing an electron beam;
  means for deflecting said electron beam in accordance with a pattern to be drawn on an object;
  means disposed along said path of said electron beam for limiting said electron beam;
  detecting means for detecting that portion of said electron beam which is prevented from passing through the limiting means;
  means disposed along said path upstream of said limiting means for deviating said electron beam so that said electron beam is prevented from bombarding said object when no pattern is to be drawn on said object;
  means for comparing an output of said detecting means with a previously set reference value and for generating an output signal corresponding to a shot of pattern writing by said electron beam on said object when the output of said detecting means exceeds said reference value;
  pattern signal generating means, connected to said deflecting means, for providing a signal to the deflecting means corresponding to a pattern to be drawn on the object; and
  controller means for comparing an output signal generated by said comparing means with a signal generated by said pattern signal generating means.

* * * * *